(12) United States Patent
Thibado et al.

(10) Patent No.: US 11,621,237 B2
(45) Date of Patent: Apr. 4, 2023

(54) INTERPOSER AND ELECTRONIC PACKAGE

(71) Applicant: Intel Corporation, Santa Clara, CA (US)

(72) Inventors: Jonathan W. Thibado, Beaverton, OR (US); Jeffory L. Smalley, East Olympia, WA (US); John C. Gulick, Portland, OR (US); Phi Thanh, Hillsboro, OR (US); Mohanraj Prabhugoud, Hillsboro, OR (US); Chong Zhao, West Linn, OR (US)

(73) Assignee: Intel Corporation, Santa Clara, CA (US)

( * ) Notice: Subject to any disclaimer, the term of this patent is extended or adjusted under 35 U.S.C. 154(b) by 933 days.

(21) Appl. No.: 16/247,312

(22) Filed: Jan. 14, 2019

(65) Prior Publication Data

US 2020/0227362 A1  Jul. 16, 2020

(51) Int. Cl.
*H05K 1/02* (2006.01)
*H01L 23/66* (2006.01)
(Continued)

(52) U.S. Cl.
CPC .............. *H01L 23/66* (2013.01); *G02B 6/428* (2013.01); *G02B 6/4279* (2013.01); *H01B 3/305* (2013.01); *H01B 7/04* (2013.01); *H01B 7/08* (2013.01); *H01L 23/345* (2013.01); *H01L 23/49816* (2013.01); *H01L 23/49827* (2013.01); *H01L 23/49833* (2013.01); *H01L 23/49838* (2013.01); *H01L 25/105* (2013.01); *H05K 1/0243* (2013.01); *H05K 1/181* (2013.01);
(Continued)

(58) Field of Classification Search
CPC .......... H05K 1/02; H05K 1/0212; H05K 1/00; H05K 1/18; H05K 1/181–187; H05K 2201/10121; H05K 2201/10356; H05K 2201/10378; H05K 2201/10734; H01L 23/345; H01L 23/49816; H01L 23/49827; H01L 23/49833; H01L 23/49838; H01L 23/66
USPC .......... 174/250–262; 361/764, 767–784, 790, 361/803
See application file for complete search history.

(56) References Cited

U.S. PATENT DOCUMENTS 5,574,630 A * 11/1996 Kresge ................ H01L 23/5384
257/E23.079
5,784,262 A * 7/1998 Sherman .............. H05K 3/3436
361/767

(Continued)

*Primary Examiner* — Tuan T Dinh
(74) *Attorney, Agent, or Firm* — Schwabe, Williamson & Wyatt, P.C.

(57) ABSTRACT

Embodiments include interposers for use in high speed applications. In an embodiment, the interposer comprises an interposer substrate, and an array of pads on a first surface of the interposer substrate. In an embodiment, a plurality of vias pass through the interposer substrate, where each via is electrically coupled to one of the pads in the array of pads. In an embodiment a plurality of heating elements are embedded in the interposer substrate. In an embodiment a first cable is over the first surface interposer substrate. In an embodiment, the first cable comprises an array of conductive lines along the first cable, where conductive lines proximate to a first end of the cable are electrically coupled to pads in the array of pads.

23 Claims, 10 Drawing Sheets

(51) Int. Cl.
  *H01L 23/498* (2006.01)
  *H01L 23/34* (2006.01)
  *H01B 7/04* (2006.01)
  *G02B 6/42* (2006.01)
  *H01B 3/30* (2006.01)
  *H01B 7/08* (2006.01)
  *H01L 25/10* (2006.01)
  *H05K 1/18* (2006.01)

(52) U.S. Cl.
  CPC ............ *H01L 2223/6611* (2013.01); *H01L 2223/6616* (2013.01); *H01L 2223/6694* (2013.01); *H05K 2201/10121* (2013.01); *H05K 2201/10356* (2013.01); *H05K 2201/10378* (2013.01); *H05K 2201/10522* (2013.01); *H05K 2201/10734* (2013.01)

(56) References Cited

U.S. PATENT DOCUMENTS

| | | | | |
|---|---|---|---|---|
| 6,586,684 B2* | 7/2003 | Frutschy | ............ | H05K 7/1092 |
| | | | | 361/767 |
| 6,797,891 B1* | 9/2004 | Blair | ............ | H05K 3/222 |
| | | | | 174/268 |
| 6,853,061 B2* | 2/2005 | Frutschy | ............ | H05K 1/0263 |
| | | | | 257/E23.079 |
| 6,940,729 B2* | 9/2005 | Cady | ............ | H01L 25/105 |
| | | | | 361/767 |
| 6,985,659 B2* | 1/2006 | Torigoe | ............ | H05K 1/025 |
| | | | | 385/9 |
| 7,345,359 B2* | 3/2008 | Kim | ............ | H01L 23/49833 |
| | | | | 257/730 |
| 7,474,540 B1* | 1/2009 | Dang | ............ | H01L 25/0655 |
| | | | | 174/250 |
| 7,750,446 B2* | 7/2010 | Fjelstad | ............ | H01L 23/49805 |
| | | | | 257/676 |
| 8,059,424 B2* | 11/2011 | Glever | ............ | H01L 23/49816 |
| | | | | 361/767 |
| 2006/0065431 A1* | 3/2006 | Trucco | ............ | B23K 3/0307 |
| | | | | 174/250 |
| 2011/0121922 A1* | 5/2011 | Blair | ............ | H01P 3/00 |
| | | | | 333/238 |
| 2013/0045611 A1* | 2/2013 | Macdougall | ............ | H01R 12/73 |
| | | | | 439/55 |
| 2017/0179067 A1* | 6/2017 | Aoki | ............ | H05K 3/3436 |
| 2017/0186661 A1* | 6/2017 | Aoki | ............ | H01L 23/49822 |
| 2018/0350767 A1* | 12/2018 | Carstens | ............ | B23K 1/19 |
| 2018/0352649 A1* | 12/2018 | Aoki | ............ | H01L 23/49833 |

* cited by examiner

INTERPOSER AND ELECTRONIC PACKAGE

TECHNICAL FIELD

Embodiments of the present disclosure relate to electronic packaging, and more particularly, to electronic packaging architectures that utilize a reflowable grid array (RGA) interposer with high speed cables.

BACKGROUND

In order to achieve high signaling speeds in today's high performance servers, it is necessary to minimize the signal routing traces in the motherboard because the loss characteristics of motherboard laminate materials is suboptimal. To accomplish this, high-speed low-loss interconnects are positioned as close to the CPU as practical. The difficulty is that many CPUs use a socketing strategy as the interconnect to the motherboard. This limits the placement of these high speed interconnects, driving systems to implement costly repeaters to meet the high speed I/O (HSIO) requirements.

Currently, a host fabric interface connector is employed directly to the edge of CPU substrates that are specifically designed to support such an interface. A HSIO coaxial cable is then mated to the connector utilizing a ground isolation to reduce losses at the interface. However, the fabric interface connector is typically a linear edge connector (LEC). Furthermore, since the connector is coupled to the edge of the CPU substrate, the number of connections that may be made is limited. This results in suboptimal bandwidths being supportable by such interface topologies. Additionally, such a solution is limited in the speeds that can be achieved because of the connection between the LEC and the coaxial cable that the signals pass through. Accordingly, such designs are not suitable for high speeds (e.g., 50 GHz or greater) and is not scalable beyond current demands.

EMBODIMENTS OF THE PRESENT DISCLOSURE

Described herein are electronic packages that comprise a reflowable grid array (RGA) interposer with high speed I/O (HSIO) cables, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, currently available interconnect topologies are limited in their bandwidth. Accordingly, embodiments disclosed herein include interconnect topologies that allow for flexible HSIO cables to be implemented as an array connector that can support many channels of I/O in order to provide speeds of 50 GHz or greater. In an embodiment, the cable (also referred to as a communication fabric) may attach to a grid array between the CPU package and the RGA interposer and/or under the RGA interposer. In other embodiments, the HSIO cable may be attached to an array of pads adjacent to the CPU package. Accordingly, embodiments allow for an inexpensive higher performing HSIO interface connection system that is not limited by the edge of the CPU substrate.

Additionally, the use of an RGA interposer allows for late attach of the flexible HSIO cables. For example, the RGA interposer may have embedded heating elements that are configured in zones that allow for selective heating of different regions of the RGA interposer. As such, the interfaces where the cables are attached may be heated (to enable solder reflow) at any point during the assembly process, or in the field. This provides greater design flexibility in addition to allowing for reconfiguring the system as technologies continue to advance.

Figure 1A:
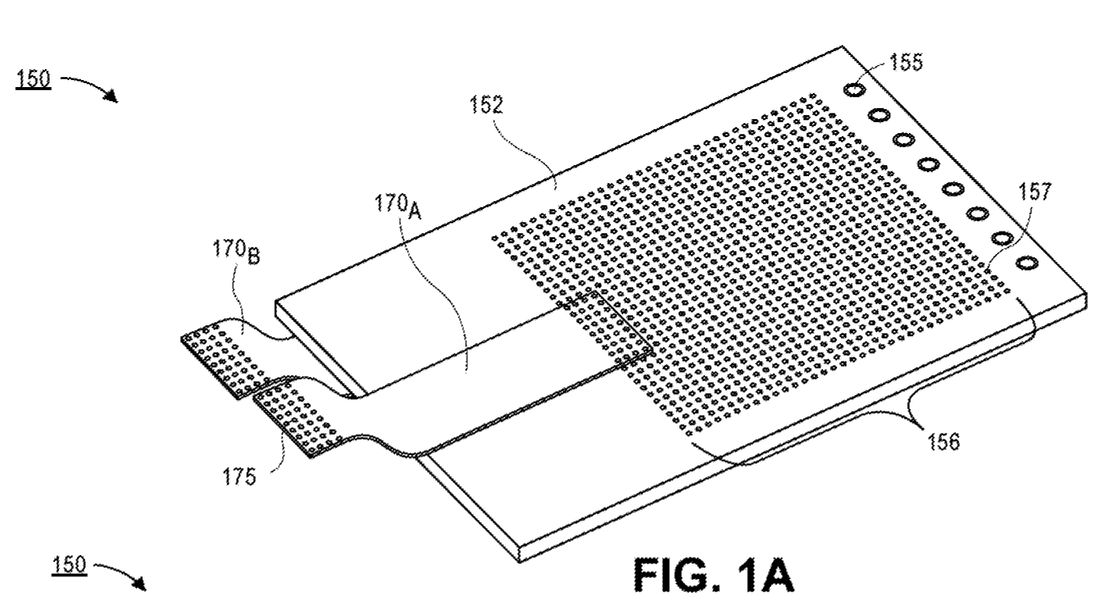
FIG. 1A is a perspective view illustration of a reflowable grid array (RGA) interposer with flexible high speed I/O (HSIO) cables, in accordance with an embodiment.
Figure 1B:
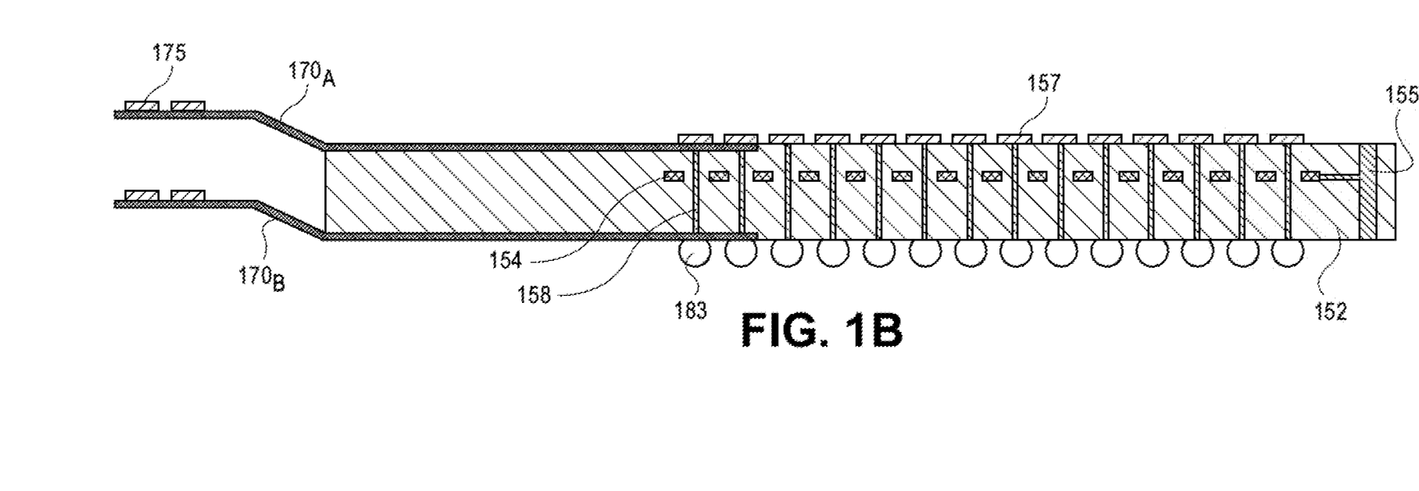
FIG. 1B is a cross-sectional illustration of an RGA interposer with flexible HSIO cables, in accordance with an embodiment.

Referring now to FIGS. 1A and 1B, a perspective view illustration and a cross-sectional view illustration of an RGA interposer 150 are shown, respectively, in accordance with an embodiment. In an embodiment, the RGA interposer 150 may comprise an interposer substrate 152. The interposer substrate 152 may be any buildup material formed from a plurality of laminated layers using standard manufacturing processes. However, due to the size of the RGA interposer (e.g., smaller than typical motherboard substrates), high density techniques may be implemented without excessive cost. For example, blind and buried via structures, stacked vias structures, or non-standard laminate materials may be used.

Accordingly, the RGA interposer 150 may comprise a plurality of high density vias 158 that extend through a thickness of the interposer substrate 152. In an embodiment, each of the vias 158 may be coupled to a pad 157 on the top surface of the interposer substrate 152. In an embodiment, the pads 157 may be arranged in an array 156 over the top surface of the interposer substrate 152. The array 156 of pads 157 may be suitable for connecting a CPU or a packaged CPU (not shown in FIGS. 1A and 1B). In an embodiment, the opposite end of the vias 158 may be coupled to solder bumps 183 or the like. The solder bumps 183 provide an interconnect to an underlying motherboard (not shown in FIGS. 1A and 1B) to provide an electrical connection from the CPU to the motherboard.

In an embodiment, the RGA interposer 150 may also comprise a plurality of heating elements 154 embedded in the interposer substrate 152. In an embodiment, the heating elements 154 may be resistive heating elements (e.g., copper traces). In some embodiments, the heating elements 154 may comprise a plurality of zones in order to enable localized heating within the interposer substrate. The heating elements 154 may be electrically coupled to heating contacts 155. The heating contacts 155 provide an access point where current can be applied to the heating elements 154 in order to generate heat in the interposer substrate 152. Particularly, the heat may be applied in order to allow for localized reflow of interconnects (e.g., ball grid array (BGA), land grid array (LGA), etc.) over the pads 157. This is particularly beneficial since the reflow may be implemented at any time during assembly (e.g., to enable late attach processes) and/or to enable rework of the RGA interposer 150 in the field to allow for reconfiguration as needed.

In an embodiment, the RGA interposer 150 may comprise one or more HSIO cables 170. The HSIO cables 170 may be a flexible cable. For example, the HSIO cables 170 may comprise a polyamide sheet or other flexible material with desired dielectric properties that enable high speed I/O signaling speeds (e.g., greater than 50 GHz). Conductive traces (e.g., copper) may be embedded in or formed over the polyamide sheet. The conductive traces (not shown for simplicity) may provide an electrical connection from a first end of the HSIO cable 170 to a second end of the HSIO cable 170. For example, the conductive traces may end at an array of pads 175 formed at one end of the HSIO cable 170. The pads 175 may be suitable for interconnecting to a backplane or other device. The opposite end of the conductive traces may be coupled to conductive pads 157 of the RGA interposer 150.

As shown in FIG. 1A, the HSIO cable 170 may be connected to a plurality of pads 157 and extend below the array 156 of pads 157. That is, an array of I/O connections may be made a plurality of columns into the array. For example, the HSIO cable $170_A$ in FIG. 1A extends four columns into the array 156 of pads 157. However, it is to be appreciated that the HSIO cables 170 may have any number of connections and extend into the array any number of columns. This is particularly beneficial compared to linear edge connectors (which are limited to connecting to only the outermost column of I/Os of the CPU) since a greater number of I/Os are accessible in accordance with embodiments described herein.

In an embodiment, HSIO cables 170 may be integrated into the interposer substrate 152. Particularly, the HSIO cables 170 may be integrated directly into the interposer substrate 152 during manufacture of the interposer substrate 152. That is, the HSIO cables 170 may be a laminated layer of the interposer substrate. For example, as shown in FIG. 1B, a portion of a first HSIO cable $170_A$ may be integrated directly into the top laminated surface of the interposer substrate 152, and a portion of a second HSIO cable $170_B$ may be integrated directly into the bottom surface of the interposer substrate 152. In an embodiment, the first HSIO cable $170_A$ may be positioned between pads 157 and the underlying vias 158. In an embodiment, the second HSIO cable $170_B$ may be positioned between the vias 158 and the underlying solder balls 183. In additional embodiments, HSIO cables may also be embedded in the interposer substrate 152, and exit out a sidewall surface of the interposer substrate 152.

In the embodiments illustrated in FIG. 1A and FIG. 1B, there are two HSIO cables $170_A$ and $170_B$ shown. However, it is to be appreciated that embodiments are not limited to such configurations. For example, the RGA interposer 150 may comprise a single HSIO cable 170, or two or more HSIO cables 170. Furthermore, while the first HSIO cable $170_A$ is shown on the top surface of the RGA interposer 150 and the second HSIO cable $170_B$ is shown on the bottom surface of the RGA interposer 150, embodiments are not limited to such configurations. For example, two or more HSIO cables 170 may be positioned over the top surface with no HSIO cables 170 on the bottom surface, or vice versa.

Additionally, the HSIO cables 170 do not need to extend out from the same edge of the RGA interposer 150, nor do the HSIO cables 170 need to be coupled to the same columns of the array 156 of pads 157, as shown in FIGS. 1A and 1B. In the embodiment illustrated in FIG. 1A, the first HSIO cable $170_A$ is offset from the second HSIO cable $170_B$ in order to allow for connections to different pads 157 in the array 156. It is to be appreciated that in FIG. 1B, the cross-sectional illustration is not a true cross-section of FIG. 1A, and the first HSIO cable $170_A$ and the second HSIO cable $170_B$ are shown in the same plane for simplicity. For example, in many embodiments, a true cross-section along the length of the first HSIO cable $170_A$ would not include the presence of the second HSIO cable $170_B$.

Figure 2A:
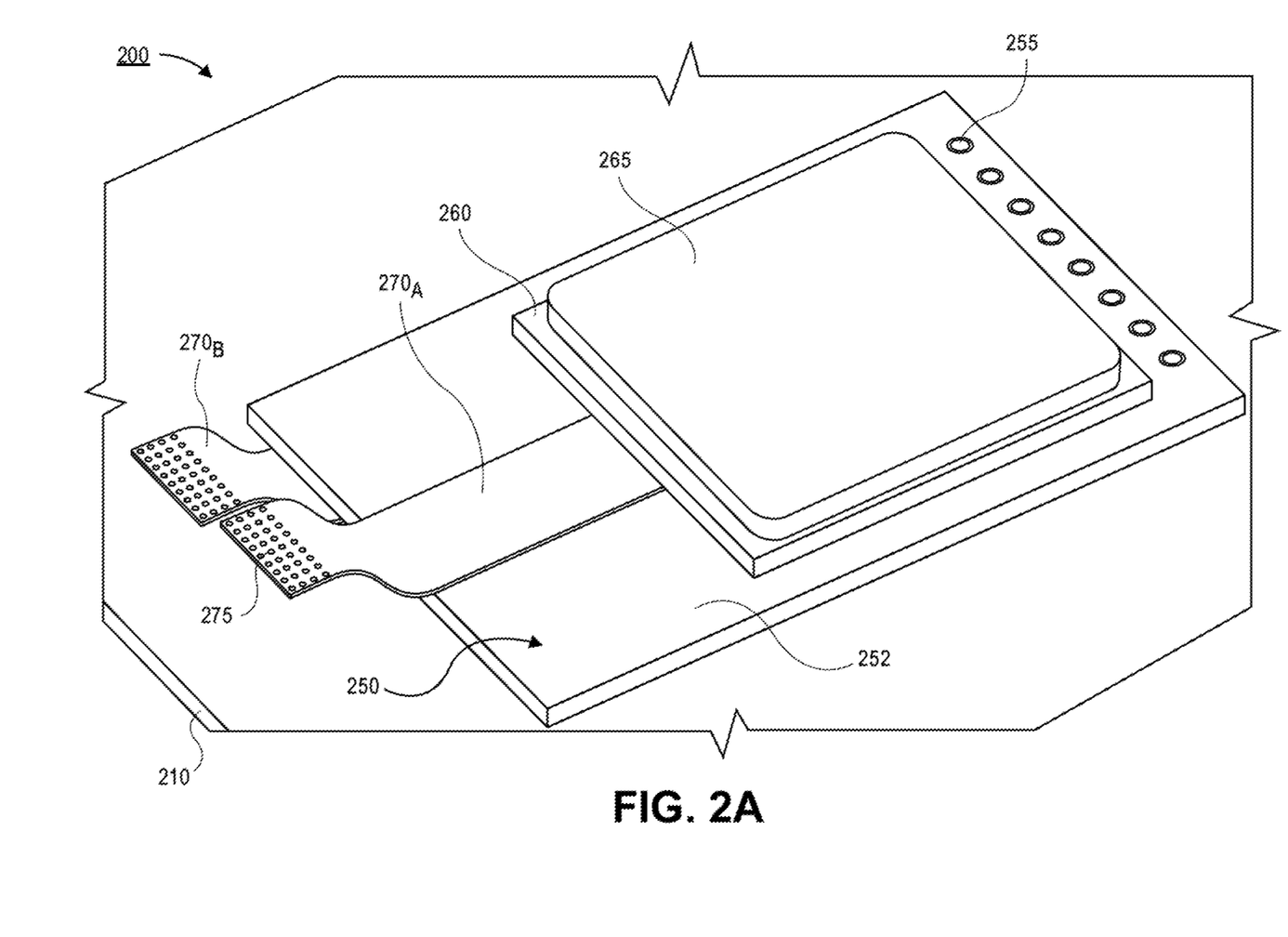
FIG. 2A is a perspective view illustration of an electronic package that comprises an RGA interposer with flexible HSIO cables, in accordance with an embodiment.
Figure 2B:
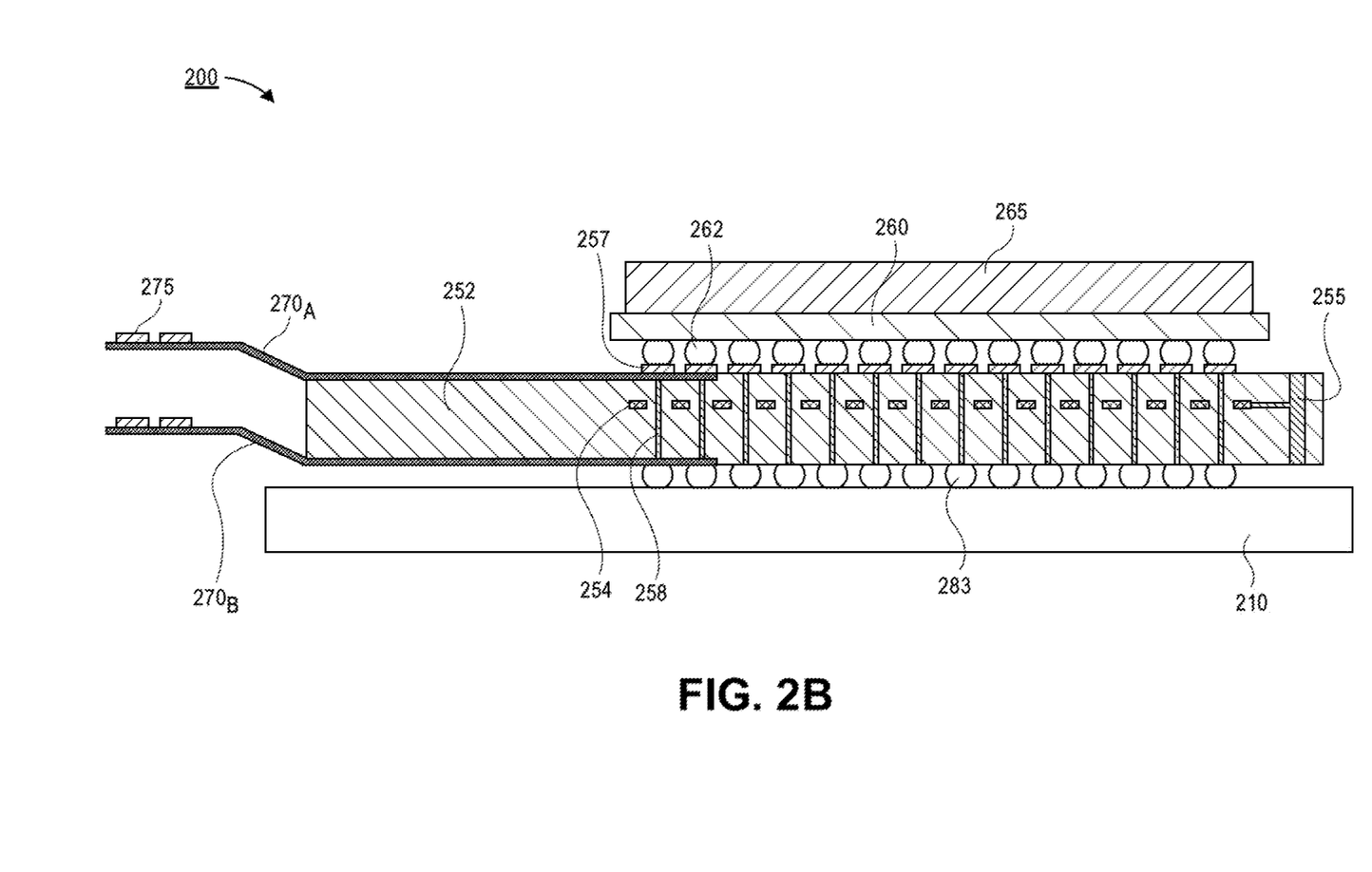
FIG. 2B is a cross-sectional illustration of an electronic package that comprises an RGA interposer with flexible HSIO cables, in accordance with an embodiment.

Referring now to FIGS. 2A and 2B, a perspective view illustration and a cross-sectional view illustration of a system 200 that includes an RGA interposer 250 are shown, respectively, in accordance with an embodiment. In an embodiment, the RGA interposer 250 may be substantially similar to the RGA interposer 150 described above with respect to FIGS. 1A and 1B. For example, the RGA interposer 250 may comprise an interposer substrate 252, vias 258, heating elements 254, and pads 257. In an embodiment, a first end of HSIO cables $270_A$ and $270_B$ may be integrated into the RGA interposer 250 and be positioned between the pads 257 and the interposer substrate 252 and/or between the vias 258 and the solder balls 283. In an embodiment, the HSIO cables $270_A$ and $270_B$ may comprise conductive traces (not shown) that terminate at an array of pads 275.

In an embodiment, the RGA interposer 250 may be electrically and mechanically coupled to a motherboard 210 with solder balls 283. In an embodiment, the RGA interposer 250 may be coupled to the motherboard 210 with standard processes (e.g., a reflow process). In an embodiment, a CPU 265 and CPU package substrate 260 may be coupled to the top surface of the RGA interposer 250 with interconnects 262 (e.g., BGA, LGA, or the like). In an embodiment, the reflow temperature of the interconnects 262 may be lower than the reflow temperature of the solder balls 283. Particularly, the interconnects 262 may have a reflow temperature that is obtainable by activating the heating elements 254 embedded in the interposer substrate 252. Accordingly, the CPU 265 may be attached to the interposer substrate 252 after the assembly of the RGA interposer to 250 to the motherboard 210. For example, a power source may be brought into contact with the heating contacts 255 at any point during assembly (or in the field) in order to initiate reflow of the interconnects 262.

Figure 3A:
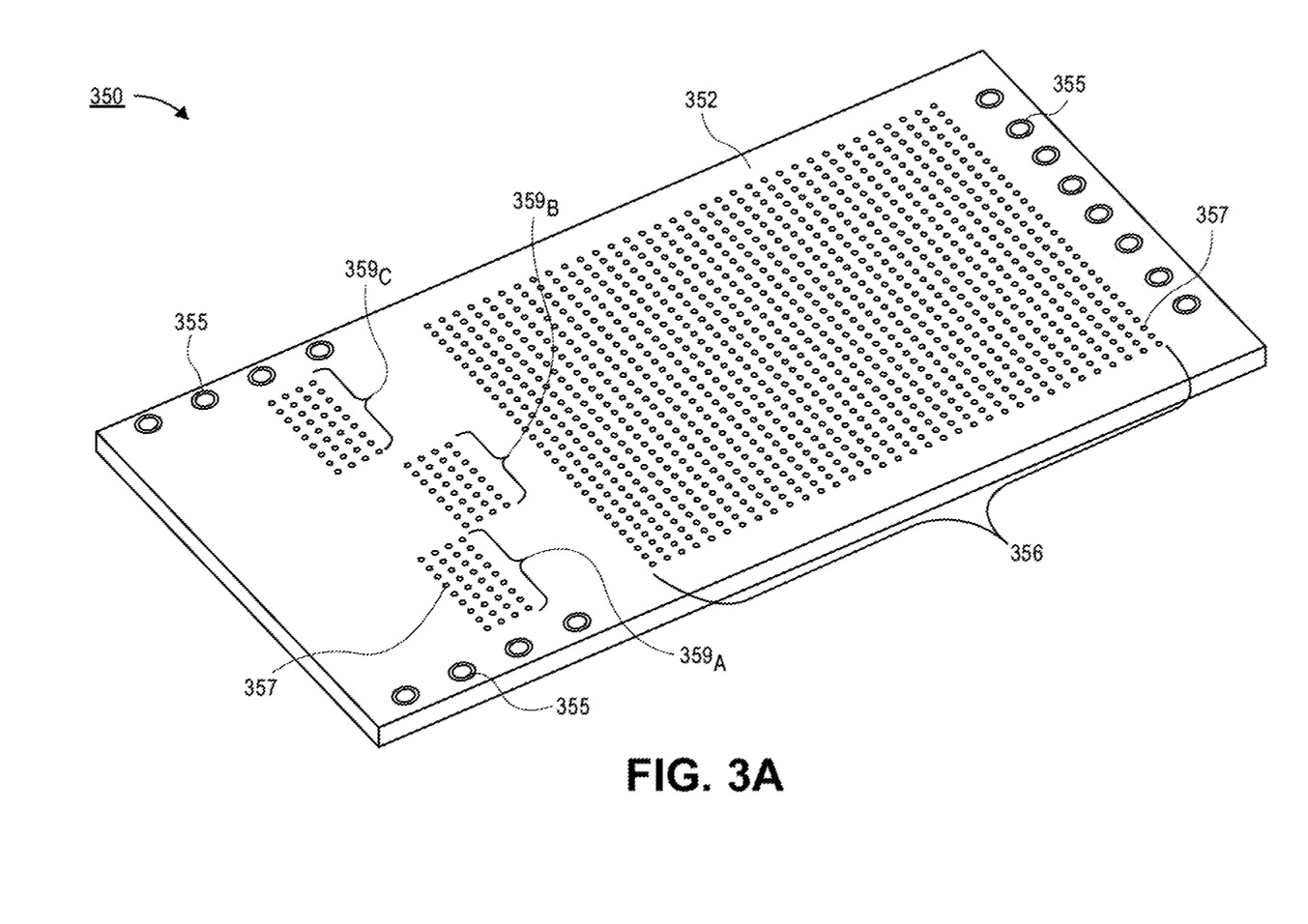
FIG. 3A is a perspective view illustration of an RGA interposer with a plurality of pad arrays for accommodating a plurality of flexible HSIO cables, in accordance with an embodiment.
Figure 3B:
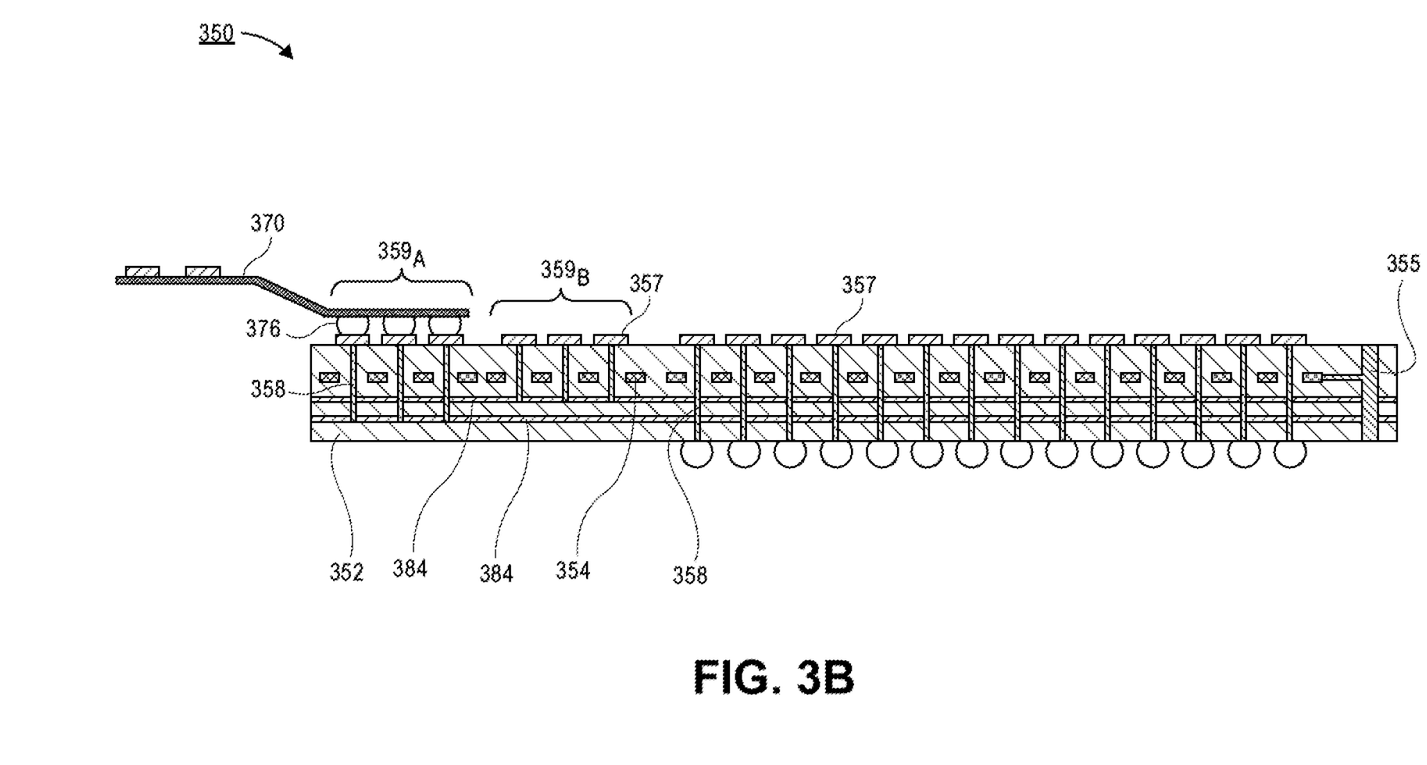
FIG. 3B is a cross-sectional illustration of an RGA interposer with a plurality of pad arrays for accommodating a plurality of flexible HSIO cables, in accordance with an embodiment.

Referring now to FIG. 3A and FIG. 3B, a perspective view illustration and a cross-sectional view illustration of an RGA interposer 350 with dedicated arrays 359 of pads 357 to which HSIO cables 370 may be attached are shown, respectively, in accordance with an embodiment. In an embodiment, the RGA interposer 350 may include a plurality of arrays of pads 357. A first array 356 of pads 357 may be for connecting a CPU (not shown) to the interposer substrate 352. One or more arrays $359_{A-C}$ may be for connecting HSIO cables 370. Accordingly, the connection of the HSIO cables 370 to the RGA interposer 350 may be adjacent to the CPU instead of being below the CPU, as shown in the embodiments in FIGS. 2A and 2B. That is, the HSIO cables 370 may be referred to as being adjacent to the CPU in some embodiments. While three arrays $359_{A-C}$ are shown in FIG. 3A, it is to be appreciated that any number of arrays 359 may be included in various embodiments. In some embodiments, more arrays 359 than HSIO cables 370 may be included on the RGA interposer 350. The additional arrays 359 allow for additional HSIO cables 370 to be added subsequent to the original assembly (e.g., to allow for expansion at a later time).

In an embodiment, vias 358 may connect the pads 357 in the arrays 359 to signal routing traces 384 that are embedded in the interposer substrate 352. Accordingly, various pads 357 in the first array 356 may be electrically coupled to the pads 357 in the arrays 359 used to attach the HSIO cables 370 to the RGA interposer 350.

In an embodiment, heating elements 354 may also be positioned proximate to the arrays 359. In a particular embodiment, the heating elements 354 may be arranged in zones proximate to each of the arrays $359_{A-C}$. For example, heating contacts 355 may be used to heat one or more zones of heating elements 354. As such, HSIO cables 370 may be added or removed with a localized reflow of interconnects 376 in a single array 359 without causing reflow of interconnects 376 in a neighboring array 359 or the CPU array 356. Therefore, embodiments allow for the RGA interposer 350 to be configured in the late integration phase of system assembly, and the RGA interposer 350 supports enhanced flexibility in system design, reuse, and/or reconfiguration.

Figure 4A:
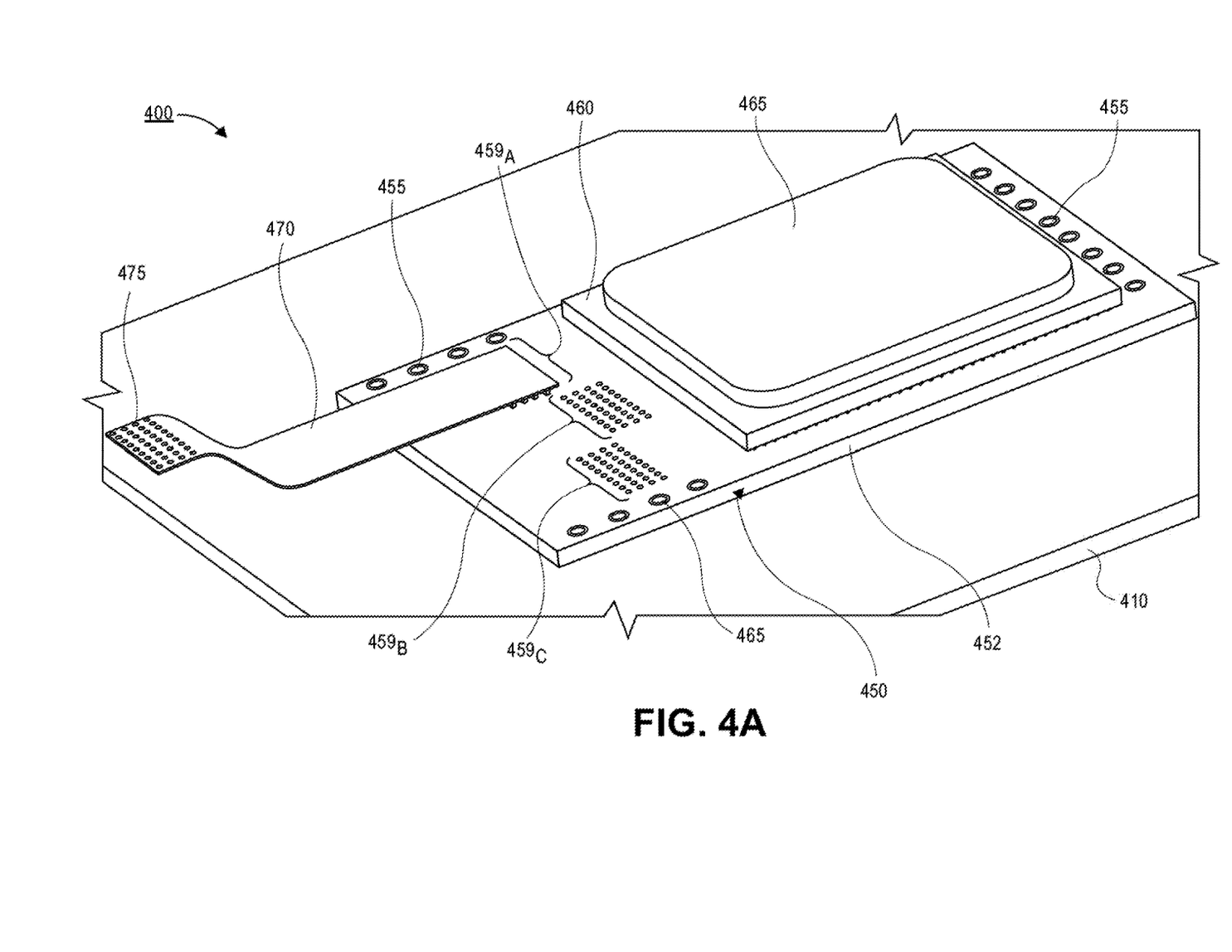
FIG. 4A is a perspective view illustration of an electronic package that comprises an RGA interposer with a plurality of pad arrays for accommodating a plurality of flexible HSIO cables, in accordance with an embodiment.
Figure 4B:
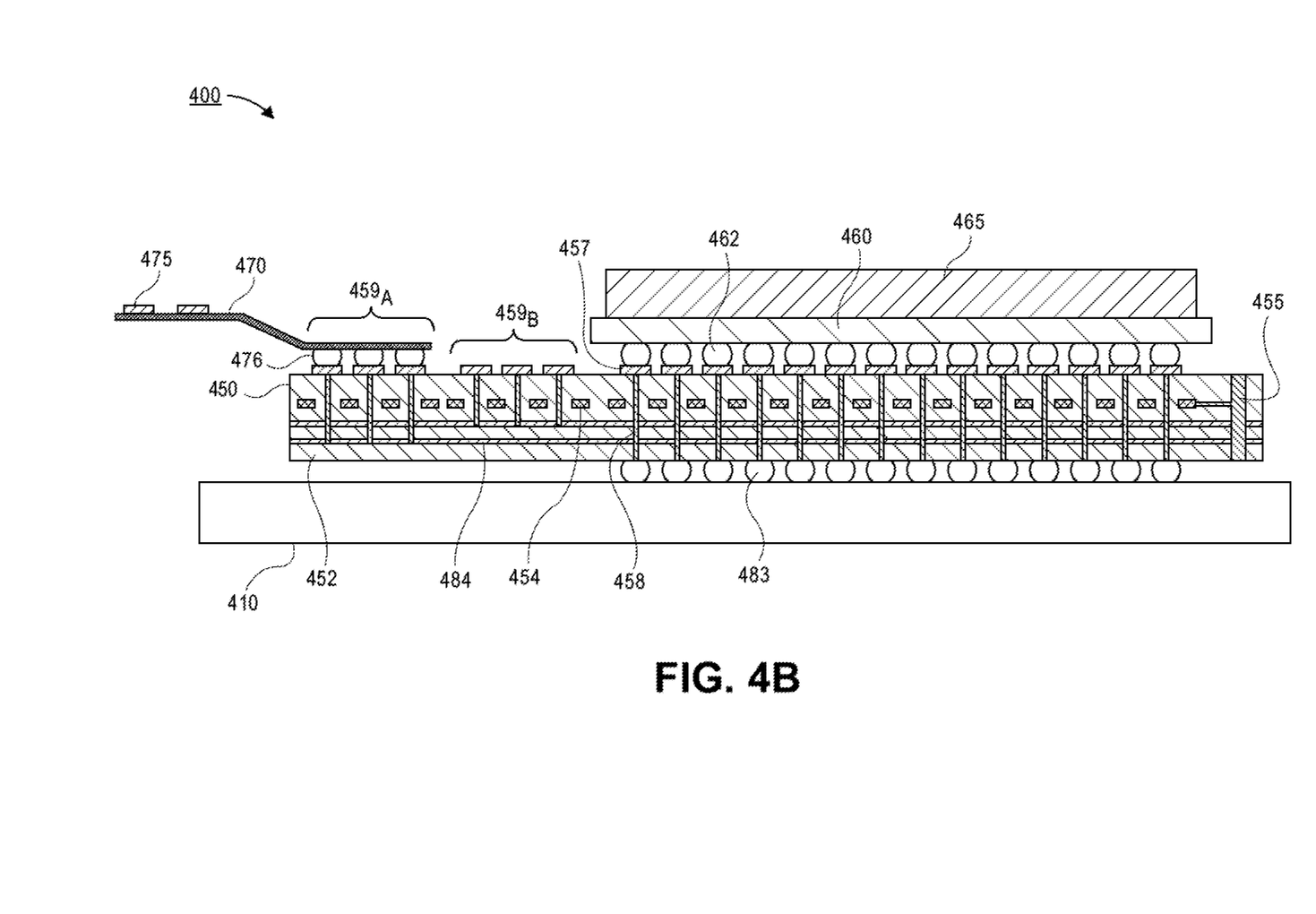
FIG. 4B is a cross-sectional illustration of an electronic package that comprises an RGA interposer with a plurality of pad arrays for accommodating a plurality of flexible HSIO cables, in accordance with an embodiment.

Referring now to FIGS. 4A and 4B, a perspective view illustration and a cross-sectional view illustration of a system 400 with an RGA interposer 450 with HSIO cables are shown, respectively, in accordance with an embodiment. In an embodiment, the RGA interposer 450 may be substantially similar to the RGA interposer 350 described above with respect to FIGS. 3A and 3B. For example, the RGA interposer 450 may comprise an interposer substrate 452, vias 458, heating elements 454, heating contacts 455, signal routing traces 484, and pads 457. In an embodiment, a first end of HSIO cables 470 may be attached to one of the arrays $459_{A-C}$ on the interposer substrate 452. In an embodiment, the HSIO cables 470 may comprise conductive traces (not shown) that terminate at an array of pads 475.

In an embodiment, the RGA interposer 450 may be electrically and mechanically coupled to a motherboard 410 with solder balls 483. In an embodiment, the RGA interposer 450 may be coupled to the motherboard 410 with standard processes (e.g., a reflow process). In an embodiment, a CPU 465 and CPU package substrate 460 may be coupled to the top surface of the RGA interposer 450 with interconnects 462 (e.g., BGA, LGA, or the like).

In an embodiment, the reflow temperature of the interconnects 462 may be lower than the reflow temperature of the solder balls 483. Particularly, the interconnects 462 may have a reflow temperature that is obtainable by activating the heating elements 454 embedded in the interposer substrate 452. Accordingly, the CPU 465 may be attached to the interposer substrate 452 after the assembly of the RGA interposer to 450 to the motherboard 410. For example, a power source may be brought into contact with the heating contacts 455 at any point during assembly (or in the field) in order to initiate reflow of the interconnects 462. The interconnects 476 that connect the HSIO cable 470 to the pads 457 may also have a lower reflow temperature than the solder balls 483. Accordingly, HSIO cables 470 may also be attached with a reflow process by activating the heaters 454 proximate to the desired array 459 of pads 457. As such, HSIO cables 470 may be attached to the interposer substrate 452 after the assembly of the RGA interposer to 450 to the motherboard 410. For example, a power source may be brought into contact with the heating contacts 455 at any point during assembly (or in the field) in order to initiate reflow of the interconnects 476.

Figure 5:
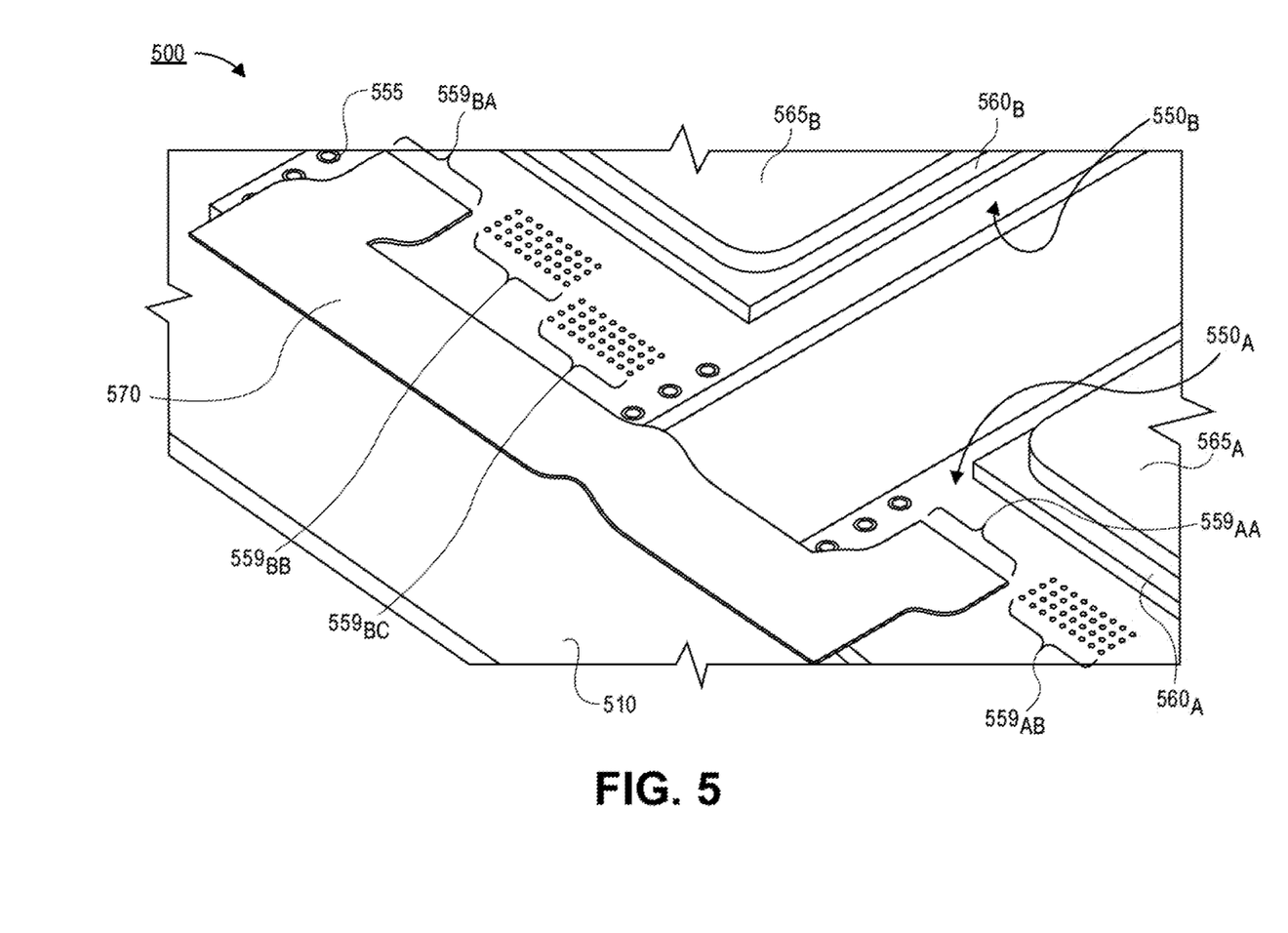
FIG. 5 is a perspective view illustration of an electronic package that comprises a pair of RGA interposers that are interconnected by a flexible HSIO cable, in accordance with an embodiment.

Referring now to FIG. 5, a perspective view illustration of a system 500 with an HSIO cable 570 that provide a communication link between a first CPU $565_A$ and a second CPU $565_B$ is shown, in accordance with an embodiment. In an embodiment, the system 500 may comprise a first RGA interposer $550_A$ and a second RGA interposer $550_B$. As shown, the RGA interposers $550_A$ and $550_B$ may be substantially similar to the RGA interposer 450 described above with respect to FIG. 4A. For example, the RGA interposers 550 may comprise a plurality of arrays (e.g., arrays $559_{AA-BC}$) to which HSIO cables 570 may be connected. The arrays $559_{AA-BC}$ may each comprise their own zone of heaters (embedded in the interposer substrate $552_A$ or $552_B$) that are connected to heater contacts 555. Additionally, a CPU 565 and CPU package 560 may be attached to each RGA interposer 550. For example, CPU $565_A$ and CPU package $560_A$ may be attached to RGA interposer $550_A$ and CPU $565_B$ and CPU package $560_B$ may be attached to RGA interposer $550_B$. In an embodiment, the first RGA interposer $550_A$ and the second RGA interposer $550_B$ may be attached to a motherboard 510. In other embodiments, the first RGA interposer $550_A$ and the second RGA interposer $550_B$ may be attached to different motherboards 510.

In an embodiment, a first end of the HSIO cable 570 is attached to an array $559_{AA}$ on the first RGA interposer $550_A$ and a second end of the HSIO cable 570 is attached to an array $559_{BA}$ on the second RGA interposer $550_B$. Accordingly, the CPUs $565_A$ and $565_B$ may be able to communicate with each other over the HSIO cable 570. While a single HSIO cable 570 is shown, it is to be appreciated that any number of HSIO cables 570 may be used to provide a communication link between the RGA interposers $550_A$ and $550_B$. Furthermore, each RGA interposer 550 may have communication links provided by an HSIO cable 570 to any number of RGA interposers 550 (e.g., one or more different RGA interposers 550). Additionally, while the HSIO cable 570 is shown as connecting two RGA interposers $550_A$ and $550_B$, it is to be appreciated that similar HSIO cables 570 may be used to attach an RGA interposer 550 to any other device. That is, an RGA interposer 550 may be coupled to a device that does not include an RGA interposer 550 by an HSIO cable 570.

While system 500 is shown using RGA interposers 550 that are similar to those shown in FIGS. 3A and 3B, it is to be appreciated that any RGA interposers may be connected with HSIO cables 570. For example, the HSIO cables 570 may be integrated into the interposer substrate, similar to the embodiments shown in FIGS. 1A and 1B.

Figure 6:
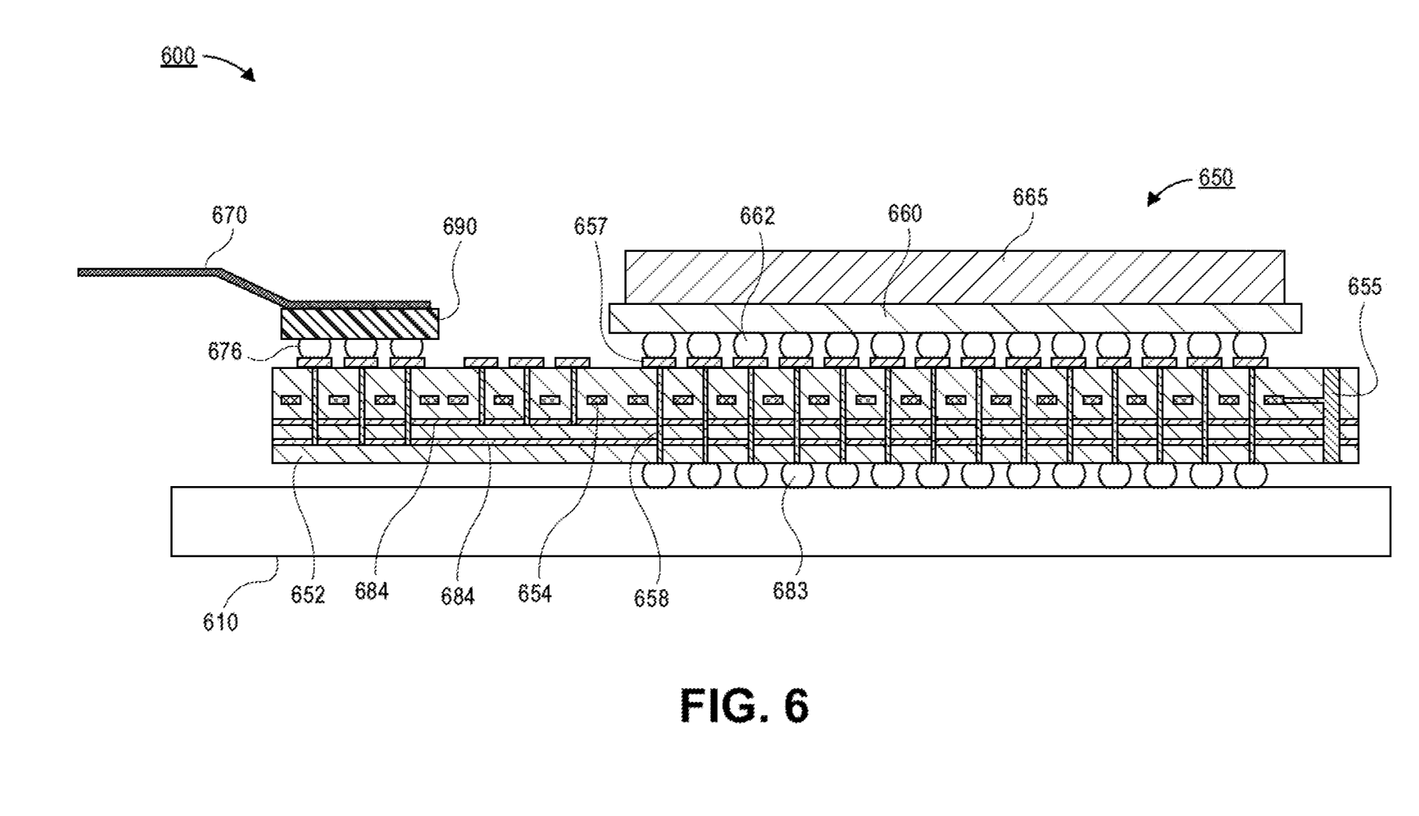
FIG. 6 is a cross-sectional illustration of an electronic system with an RGA interposer with an electrical-to-optical converter to enable the use of optical cables, in accordance with an embodiment.

Referring now to FIG. 6, a cross-sectional illustration of a system 600 with an RGA interposer 650 is shown, in accordance with an embodiment. In an embodiment, the system 600 may be similar to the system 400 shown in FIG. 4B, with the exception that the HSIO cable 670 is coupled to the RGA interposer 650 through an electrical-to-optical converter die 690. The electrical-to-optical converter die 690 may convert electrical signals from the CPU 665 to an optical signal that may then be transmitted along the HSIO cable 670. For example, the HSIO cable 670 may be an optical cable (e.g., a fiber optic cable or bundle to fiber optic cables). The conversion to an optical signal may allow for even higher communication speeds.

Similar to system 400, system 600 may also include an RGA interposer 650 that is substantially similar to the RGA interposer 450 that is coupled to a motherboard 610 with solder balls 683. The RGA interposer 650 may comprise an interposer substrate 652. Vias 658 and signal routing traces 684 may be embedded in the interposer substrate 652 to allow communication between pads 657 to which the electrical-to-optical converter die 690 is attached (with interconnects 676) and pads 657 to which the CPU package 660 is attached (with interconnects 662). In an embodiment, the RGA interposer 650 may also include heating elements 654 that are coupled to heating contacts 655.

Figure 7:
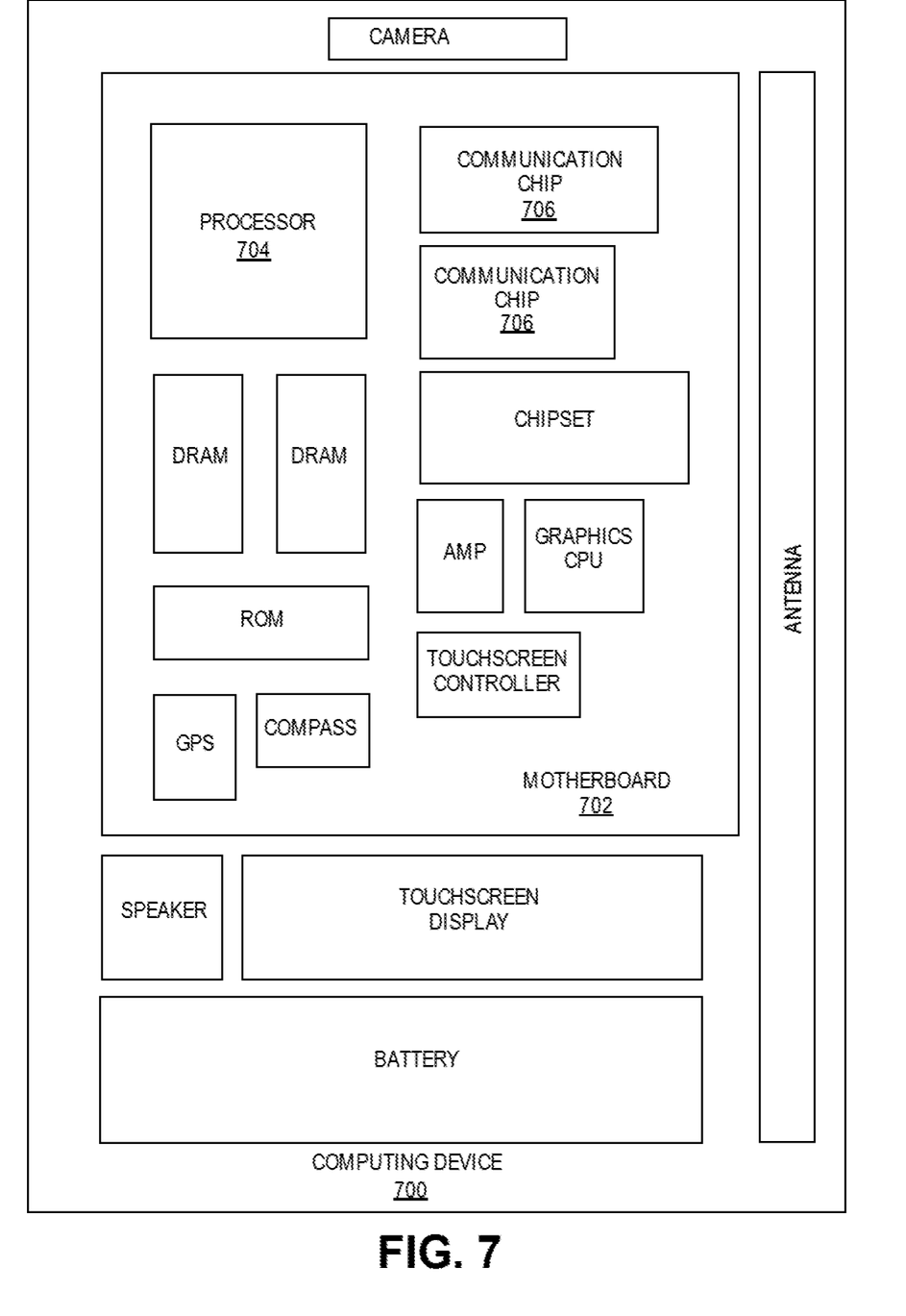
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged in an electronic system that comprises an RGA interposer with an HSIO cable, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged in an electronic system that comprises an RGA interposer with an HSIO cable, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an interposer, comprising: an interposer substrate; an array of pads on a first surface of the interposer substrate; a plurality of vias through the interposer substrate, wherein each via is electrically coupled to one of the pads in the array of pads; a plurality of heating elements embedded in the interposer substrate; and a first cable over the first surface interposer substrate, the first cable comprising: an array of conductive lines along the first cable, wherein conductive lines proximate to a first end of the cable are electrically coupled to pads in the array of pads.

Example 2: the interposer of Example 1, wherein the first cable is between the pads and the first surface of the interposer.

Example 3: the interposer of Examples 1-3, wherein the first cable is a flexible cable.

Example 4: the interposer of Examples 1-4, wherein the flexible cable comprises a polyamide sheet.

Example 5: the interposer of Examples 1-5, further comprising: a second cable over a second surface of the interposer substrate, wherein the second cable comprises an array of conductive lines along the second cable, wherein the conductive lines proximate to a first end of the second cable are electrically coupled to vias through the interposer substrate.

Example 6: the interposer of Examples 1-5, wherein the first cable and the second cable are offset from each other.

Example 7: the interposer of Examples 1-6, wherein the first cable and the second cable extend away from the same edge of the array of pads.

Example 8: an interposer, comprising: an interposer substrate; a first array of pads on a first surface of the interposer substrate; a plurality of vias through the interposer substrate, wherein each via is electrically coupled to one of the pads in the first array of pads; a plurality of heating elements embedded in the interposer substrate; a second array of pads on the first surface of the interposer substrate, wherein pads in the second array of pads are electrically coupled to pads in the first array of pads through conductive traces embedded in the interposer substrate; and a first cable electrically coupled to the second array of pads.

Example 9: the interposer of Example 8, wherein the first cable is a flexible cable.

Example 10: the interposer of Example 8 or Example 9, wherein the flexible cable comprises a polyamide sheet.

Example 11: the interposer of Examples 8-10, further comprising: a third array of pads on the first surface of the interposer substrate, wherein pads in the third array of pads are electrically coupled to pads in the first array of pads through conductive traces embedded in the interposer substrate.

Example 12: the interposer of Examples 8-11, further comprising: a second cable electrically coupled to the pads in the third array of pads.

Example 13: the interposer of Examples 8-12, wherein the first cable is electrically coupled to the second array of pads by an electrical-to-optical converter die.

Example 14: the interposer of Examples 8-13, wherein the first cable is an optical cable.

Example 15: the interposer of Examples 8-14, wherein the plurality of heating elements comprises a first zone of heating elements proximate to the pads in the first array of pads, and a second zone of heating elements proximate to the pads in the second array of pads, and wherein the first zone and the second zone are independently operated.

Example 16: an electronic package, comprising: a motherboard; a first interposer over the motherboard; a first die electrically coupled to the first interposer; a second interposer over the motherboard; a second die electrically coupled to the second interposer; and a cable attached between the first interposer and the second interposer, wherein the cable provides a communication pathway between the first die and the second die that does not pass through the motherboard.

Example 17: the electronic package of Example 16, wherein the cable is a flexible cable.

Example 18: the electronic package of Example 16 or Example 17, wherein the cable comprises a polyamide sheet.

Example 19: the electronic package of Examples 16-18, wherein the first interposer and the second interposer both comprise embedded heaters.

Example 20: the electronic package of Examples 16-19, wherein the embedded heaters comprise a plurality of zones.

Example 21: the electronic package of Examples 16-20, wherein a first end of the cable is attached to the first interposer between the first die and the first interposer, and wherein a second end of the cable is attached to the second interposer between the second die and the second interposer.

Example 22: the electronic package of Examples 16-21, wherein a first end of the cable is attached to an array of pads on the first interposer that is adjacent to the first die, and wherein a second end of the cable is attached to an array of pads on the second interposer that is adjacent to the second die.

Example 23: the electronic package of Examples 16-22, wherein the first die and the second die are processor dies.

Example 24: the electronic package of Examples 16-23, wherein the cable provides signaling speeds of 50 GHz or greater.

Example 25: the electronic package of Examples 16-24, wherein the cable is an optical cable.

What is claimed is:

1. An interposer, comprising:
   an interposer substrate;
   an array of pads on a first surface of the interposer substrate;
   a plurality of vias through the interposer substrate, wherein each via is electrically coupled to one of the pads in the array of pads;
   a plurality of heating elements embedded in the interposer substrate; and
   a first cable over the first surface interposer substrate, the first cable comprising:
      an array of conductive lines along the first cable, wherein conductive lines proximate to a first end of the cable are electrically coupled to pads in the array of pads, and wherein the first cable vertically overlaps with at least a portion of the plurality of heating elements.

2. The interposer of claim 1, wherein the first cable is between the pads and the first surface of the interposer.

3. The interposer of claim 1, wherein the first cable is a flexible cable.

4. The interposer of claim 1, further comprising:
   a second cable over a second surface of the interposer substrate, wherein the second cable comprises an array of conductive lines along the second cable, wherein the conductive lines proximate to a first end of the second cable are electrically coupled to vias through the interposer substrate.

5. The interposer of claim 3, wherein the flexible cable comprises a polyamide sheet.

6. The interposer of claim 4, wherein the first cable and the second cable are offset from each other.

7. The interposer of claim 4, wherein the first cable and the second cable extend away from the same edge of the array of pads.

8. An interposer, comprising:
   an interposer substrate;
   a first array of pads on a first surface of the interposer substrate;
   a plurality of vias through the interposer substrate, wherein each via is electrically coupled to one of the pads in the first array of pads;
   a plurality of heating elements embedded in the interposer substrate;
   a second array of pads on the first surface of the interposer substrate, wherein pads in the second array of pads are electrically coupled to pads in the first array of pads through conductive traces embedded in the interposer substrate; and a first cable electrically coupled to the second array of pads, wherein the first cable vertically overlaps with at least a portion of the plurality of heating elements.

9. The interposer of claim 8, wherein the first cable is a flexible cable.

10. The interposer of claim 8, further comprising:
a third array of pads on the first surface of the interposer substrate, wherein pads in the third array of pads are electrically coupled to pads in the first array of pads through conductive traces embedded in the interposer substrate.

11. The interposer of claim 8, wherein the first cable is electrically coupled to the second array of pads by an electrical-to-optical converter die.

12. The interposer of claim 8, wherein the plurality of heating elements comprises a first zone of heating elements proximate to the pads in the first array of pads, and a second zone of heating elements proximate to the pads in the second array of pads, and wherein the first zone and the second zone are independently operated.

13. The interposer of claim 9, wherein the flexible cable comprises a polyamide sheet.

14. The interposer of claim 11, wherein the first cable is an optical cable.

15. An electronic package, comprising:
a motherboard;
a first interposer over the motherboard;
a first die electrically coupled to the first interposer;
a second interposer over the motherboard, wherein the first interposer and the second interposer both comprise embedded heaters;
a second die electrically coupled to the second interposer; and
a cable attached between the first interposer and the second interposer, wherein the cable provides a communication pathway between the first die and the second die that does not pass through the motherboard, and wherein the cable vertically overlaps with at least a portion of the embedded heaters in the first interposer or the second interposer.

16. The electronic package of claim 15, wherein the cable is a flexible cable.

17. The electronic package of claim 15, wherein the cable comprises a polyamide sheet.

18. The electronic package of claim 15, wherein the embedded heaters comprise a plurality of zones.

19. The electronic package of claim 15, wherein a first end of the cable is attached to the first interposer between the first die and the first interposer, and wherein a second end of the cable is attached to the second interposer between the second die and the second interposer.

20. The electronic package of claim 15, wherein a first end of the cable is attached to an array of pads on the first interposer that is adjacent to the first die, and wherein a second end of the cable is attached to an array of pads on the second interposer that is adjacent to the second die.

21. The electronic package of claim 15, wherein the first die and the second die are processor dies.

22. The electronic package of claim 15, wherein the cable provides signaling speeds of 50 GHz or greater.

23. The electronic package of claim 15, wherein the cable is an optical cable.

* * * * *